(12) United States Patent
Karino et al.

(10) Patent No.: US 6,403,875 B1
(45) Date of Patent: Jun. 11, 2002

(54) PROCESS FOR PRODUCING THERMOELECTRIC MATERIAL

(75) Inventors: Shinji Karino; Ryouma Tsukuda; Yuichi Anno; Isamu Yashima; Hitoshi Kajino, all of Ageo (JP)

(73) Assignee: Mitsui Mining & Smelting Company, Ltd., Tokyo (JP)

( * ) Notice: Subject to any disclaimer, the term of this patent is extended or adjusted under 35 U.S.C. 154(b) by 0 days.

(21) Appl. No.: 09/790,509

(22) Filed: Feb. 23, 2001

(30) Foreign Application Priority Data

Feb. 23, 2000 (JP) .......................................... 2000-45897
Feb. 23, 2000 (JP) .......................................... 2000-45898

(51) Int. Cl.$^7$ ............................................... H01L 35/34
(52) U.S. Cl. ....................... 136/201; 136/238; 136/240; 419/33; 419/38; 419/48; 419/56
(58) Field of Search .............................. 419/33, 38, 48, 419/56; 136/201, 238, 240

(56) References Cited

U.S. PATENT DOCUMENTS

| 5,103,286 A | * | 4/1992 | Ohta et al. ...................... 357/8 |
| 5,108,515 A | * | 4/1992 | Ohta et al. .................. 136/201 |
| 5,246,504 A | * | 9/1993 | Ohta et al. .................. 136/201 |
| 5,318,743 A | * | 6/1994 | Tokiai et al. ................. 419/38 |

\* cited by examiner

*Primary Examiner*—Ngoclan Mai
(74) *Attorney, Agent, or Firm*—Young & Thompson

(57) ABSTRACT

A process for producing a thermoelectric material comprising mixing at least two of bismuth, tellurium, selenium, and antimony and, if desired, a dopant, melting the mixture, grinding the resulting alloy ingot, forming the powder, and sintering the green body under normal pressure, or hot pressing the powder, wherein the grinding and the normal sintering or hot pressing are carried out in the presence of a solvent represented by $C_nH_{2n+1}OH$ or $C_nH_{2n+2}CO$ (wherein n is 1, 2 or 3).

6 Claims, No Drawings

PROCESS FOR PRODUCING THERMOELECTRIC MATERIAL

BACKGROUND OF THE INVENTION

1. Field of the Invention

The present invention relates to a process for producing a thermoelectric material which can be used as a material of thermoelectric devices utilizing Peltier effect or Seebeck effect. More particularly, it relates to a process of producing a thermoelectric material, in which grinding and normal sintering or hot pressing are carried out in the presence of a specific solvent to bring about a markedly improved figure of merit.

2. Description of Related Art

Thermoelectric devices utilizing Peltier effect have found wide application as thermoelectric electricity generators, thermosensors, etc.

Performance properties of thermoelectric materials which can provide thermoelectric devices are evaluated by the thermoelectric figure of merit Z which is obtained from Seebeck coefficient $\alpha$, thermal conductivity $\kappa$, and electrical resistivity $\rho$ (or electrical conductivity $\sigma$) as represented by equation:

$$Z = \alpha^2/(\rho \cdot \kappa) = \alpha^2 \cdot \sigma/\kappa$$

That is, in order to improve the figure of merit (to increase the figure of merit) of a thermoelectric material, it is required that the Seebeck coefficient be high, and both the specific resistance and the thermal conductivity be low.

The following process is adopted to produce a thermoelectric material for obtaining a p-type or n-type thermoelectric device, the material comprising an appropriately doped alloy comprising at least two elements selected from the group consisting of Bi, Te, Se and Sb elements. The process comprises mixing weighed amounts of Bi, Te, Se or Sb powder and a dopant, melting the mixture, grinding the resulting alloy ingot to powder, and sintering the powder to obtain a thermoelectric material as a sintered body.

Sintering techniques used here include normal sintering, hot pressing, vacuum sintering, gas-pressure sintering, plasma sintering, and hot isostatic press sintering (HIP). Normal sintering and hot pressing are particularly preferred. Normal sintering is practical for ease in producing a sintered body of complicated configuration and also from the economical standpoint. Hot pressing provides a sintered body with few cracks and excellent mechanical strength.

However, the figure of merit Z of thermoelectric materials obtained by normal sintering, hot pressing, etc. is lower than the desired range. It has been a demand to produce a thermoelectric material having a high figure of merit Z. In particular, considered that the figure of merit Z of available p-type thermoelectric devices exceeds $3.0 \times 10^{-3}$ $K^{-1}$, whereas those of available n-type ones are around $2.5 \times 10^{-3}$ $K^{-1}$, there has been a keen demand to further improve the figure of merit of n-type thermoelectric devices.

SUMMARY OF THE INVENTION

An object of the present invention is to provide an economically excellent process for producing a thermoelectric device having a low carrier density, a high mobility, and a greatly improved figure of merit.

As a result of investigation, the present inventors have found that the above object is accomplished by the presence of a specific solvent in grinding an alloy ingot obtained by mixing and melting and also in normal sintering or hot pressing the resulting powder.

The present invention has been completed based on the above finding. The present invention provides a process for producing a thermoelectric material comprising mixing at least two members selected from bismuth, tellurium, selenium, and antimony and, if desired, a dopant, melting the mixture, grinding the resulting alloy ingot, forming the powder, and sintering the green body under normal pressure, which is characterized in that the grinding and the normal sintering are carried out in the presence of a solvent represented by formula: $C_nH_{2n+1}OH$ or $C_nH_{2n+2}CO$ (wherein n is 1, 2 or 3).

The present invention also provides a process for producing a thermoelectric material comprising mixing at least two members selected from bismuth, tellurium, selenium, and antimony and, if desired, a dopant, melting the mixture, grinding the resulting alloy ingot, and hot pressing the powder, which is characterized in that the grinding and the hot pressing, are carried out in the presence of a solvent represented by formula: $C_nH_{2n+1}OH$ or $C_nH_{2n+2}CO$ (wherein n is 1, 2 or 3).

The thermoelectric material obtained by the process of the invention has a low carrier density, a high mobility, and a satisfactory figure of merit. Where normal sintering is adopted, the process is economically excellent. The thermoelectric material thus obtained are applicable to various fields as a thermoelectric device with its Peltier effect being taken into advantage of.

DETAILED DESCRIPTION OF THE INVENTION

The process for production according to the present invention will hereinafter be described in detail.

At least two members selected from bismuth, tellurium, selenium and antimony are used in the present invention as constituent elements of the thermoelectric material.

A dopant is used in addition if necessary to obtain a desired n-type thermoelectric device or a desired p-type thermoelectric device. Such a dopant includes $BiF_3$, $BiCl_3$, $BiBr_3$, $BiI_3$, $TeCl_4$, $TeI_2$, $TeI_4$, $TeBr_4$, $SeCl_4$, $SeBr_4$, $SeI_4$, $SbF_3$, $SbCl_3$, $SbCl_5$, $SbBr_3$, Se, and Te.

Weighed amounts of the constituent elements and the dopant for a thermoelectric material are mixed and melted. After mixing in a molten state, the melt is cooled to obtain an alloy ingot.

The resulting alloy ingot is round in a solvent represented by formula: $C_nH_{2n+1}OH$ or $C_nH_{2n+2}CO$ (wherein n is 1, 2 or 3) by means of a vibration mill, etc. to obtain an alloy powder having an average particle size of 0.5 to 50 $\mu m$.

The solvent represented by formula: $C_nH_{2n+1}OH$ or $C_nH_{2n+2}CO$ (wherein n is 1, 2 or 3) is methanol, ethanol, propanol, acetaldehyde, acetone or methyl ethyl ketone, with methanol or acetone being preferred. Use of such a solvent brings about an improvement on the figure of merit Z of the resulting thermoelectric material.

It is preferred for the solvent to have a dielectric constant of 21.4% or higher at 20° C., a dipole moment of $1.68 \times 10^{-16}$ c.s.u or higher, a molecular weight of 58.1 or lower, and a boiling point of 55 to 79° C.

Then the alloy powder is formed and sintered under normal pressure, or the alloy powder is hot pressed.

In the case of powder forming, followed by normal sintering, forming is preferably conducted by uniaxial pressing or cold isostatic pressing (CIP). Pressing provides a green body with an increased density.

The green body is subjected to normal sintering in the presence of the solvent at 300 to 600° C., desirably for 0.1 to 10 hours. Normal sintering in the presence of the solvent brings about improvement on the figure of merit Z of the thermoelectric material.

The normal sintering is preferably effected in two stages. Specifically, the green body of the alloy powder is heated in hydrogen gas and maintained at 300 to 600° C. for 1 to 60 minutes and then further heated in an inert gas, such as argon gas, and held at 400 to 600° C. for 1 to 60 minutes, followed by cooling.

In the case where the allow powder is hot pressed, hot pressing is performed in the presence of the solvent. Hot pressing is preferably conducted in a non-oxidizing gas atmosphere, e.g., an a room atmosphere, at 400 to 600° C. for 0.1 to 10 hours. Hot pressing in the presence of the solvent produces an improvement in the figure of merit Z of the thermoelectric material.

There is thus obtained a thermoelectric material comprising a sintered body. Specific examples of the thermoelectric material include bismuth telluride, bismuth selenide, antimony telluride, antimony selenide, bismuth sulfide, antimony sulfide, etc., which can be used either individually or as a combination thereof. Polycrystalline materials made up of a single compound such as bismuth telluride, bismuth selenide, etc. or a solid solution of these compounds are used as a material of thermoelectric devices for cooling, heat generation or electricity generation, such as a Peltier element. Use of these thermoelectric materials provides thermoelectric devices having satisfactory characteristics, especially n-type thermoelectric devices.

The thermoelectric device is joined with a metal electrode to make a thermoelectric module, the Peltier effect of which is taken advantage of in thermoelectric conversion of waste heat from various thermal engines or factories, small-scale electricity generators, simple-structured air conditioning systems, and refrigerators. The module is particularly useful as a CPU cooling module.

The present invention will now be illustrated in greater detail with reference to Examples.

EXAMPLES 1 TO 4 AND COMPARATIVE EXAMPLE 1

Tellurium, bismuth and antimony flakes were weighed out to give a bismuth selenide ($Bi_2Se_3$) to bismuth telluride ($Bi_2Te_3$) alloy ratio of 15:85 by mole. A predetermined amount of tellurium iodide was weighed out as a dopant.

These weighed materials were melted in a graphite crucible in an argon gas at 750° C. for 2 hours to obtain an alloy ingot having a desired composition.

The alloy ingot was ground in a vibrating mill together with the solvent shown in Table 1 below to obtain an alloy powder having an average particle size of 8 $\mu$m. The powder was pressed into a prescribed shape, and the green body was subjected to normal sintering by heating in a hydrogen gas atmosphere in the presence of the solvent shown in Table 1 at a rate of 15° C./min, maintaining, at 370° C. for 30 minutes, further heating in an argon atmosphere in the presence of the solvent at a rate of 15° C./min, keeping at 500° C. for 10 minutes, and slowly cooling.

The Seebeck coefficient, electrical resistivity, thermal conductivity, power factor, figure of merit, carrier density, and mobility of the resulting thermoelectric material are shown in Table 1. The mobility was obtained by combining Hall measurements and electrical resistivity.

TABLE 1

|  | Solvent | Seebeck Coefficient $\alpha$ ($\mu$V/K) | Electrical Resistivity $\rho$ (m$\Omega$ – cm) | Thermal Conductivity $\kappa$ (mW/cm · K) | Power Factor $\alpha^2/\rho$ (mW/cm · $K^2$) | Figure of Merit Z ($\times 10^{-3} K^{-1}$) | Carrier Density $\eta$ ($\times 10^{19}/cm^3$) | Mobility $\mu$ ($cm^2$/V · S) |
|---|---|---|---|---|---|---|---|---|
| Example 1 | methanol | −215 | 1.71 | 10.0 | 27.0 | 2.70 | 1.48 | 225 |
| Example 2 | acetone | −217 | 1.92 | 9.12 | 24.6 | 2.69 | 1.50 | 217 |
| Example 3 | ethanol | −217 | 1.95 | 9.21 | 24.2 | 2.62 | 1.51 | 212 |
| Example 4 | methyl ethyl ketone | −217 | 1.96 | 9.23 | 24.0 | 2.61 | 1.53 | 211 |
| Comparative Example 1 | hexane | −216 | 1.93 | 9.32 | 24.2 | 2.60 | 1.57 | 206 |

As is shown in Table 1, the thermoelectric materials of Examples 1 to 4 have a lower carrier density, a higher mobility, and a higher figure of merit than those of Comparative Example 1. These improving effects are conspicuous in Examples 1 and 2 where methanol and acetone are used as a solvent, respectively. A difference of figure of merit by 0.01 corresponds to a difference in cooling ability by about 3° C.

EXAMPLES 5 TO 8 AND COMPARATIVE EXAMPLE 2

The same alloy ingot as used in Example 1 was ground in a vibration mill together with the solvent shown in Table 2 to obtain an alloy powder having an average particle size of 8 $\mu$m. The powder was hot pressed in an argon gas/hydrogen gas (1%) mixture in the presence of the solvent shown in Table 2 under a pressure of 300 kg/$cm^2$ at 590° C. for 1 hour.

The Seebeck coefficient, electrical resistivity, thermal conductivity, power factor, figure of merit, carrier density, and mobility of the resulting thermoelectric material are shown in Table 2.

TABLE 2

| | Solvent | Seebeck Coefficient α (μV/K) | Electrical Resistivity ρ (mΩ · cm) | Thermal Conductivity κ (mW/cm · K) | Power Factor α²/ρ (mW/cm · K²) | Figure of Merit Z (×10⁻³K⁻¹) | Carrier Density η (×10¹⁹/cm³) | Mobility μ (cm²/V · S) |
|---|---|---|---|---|---|---|---|---|
| Example 5 | methanol | −242 | 1.73 | 12.3 | 33.8 | 2.75 | 2.21 | 170 |
| Example 6 | acetone | −235 | 1.70 | 12.4 | 32.5 | 2.62 | 2.42 | 164 |
| Example 7 | acetaldehyde | −230 | 1.61 | 12.4 | 32.9 | 2.66 | 2.56 | 159 |
| Example 8 | methyl ethyl ketone | −238 | 1.72 | 12.2 | 32.9 | 2.70 | 2.61 | 156 |
| Comparative Example 2 | hexane | −230 | 1.53 | 12.9 | 34.6 | 2.66 | 3.22 | 132 |

As is shown in Table 2, the thermoelectric materials of Examples 5 to 8 have a lower carrier density and a higher mobility than those of Comparative Example 2. These improving effects are conspicuous in Example 5 where methanol is used as a solvent. A difference of the figure of merit by 0.01 corresponds to a difference in cooling ability by about 3° C.

What is claimed is:

1. A process for producing a thermoelectric material comprising mixing at least two members selected form bismuth, tellurium, selenium, and antimony and, if desired, a dopant, melting the mixture, grinding the resulting alloy ingot to form a powder, forming the power into a green body, and sintering the green body, wherein the grinding and the sintering are carried out in the presence of a solvent represented by formula: $C_nH_{2n+1}OH$ or $C_nH_{2n+2}CO$ (wherein n is 1, 2 or 3).

2. The process for producing a thermoelectric material as claimed in claim 1, wherein the sintering is carried out by raising temperature in a hydrogen gas atmosphere, maintaining at a raised temperature, further raising temperature in an inert gas atmosphere, and maintaining at a raised temperature.

3. A process for producing a thermoelectric material comprising mixing at least two members selected from bismuth, tellurium, selenium, and antimony and, if desired, a dopant, melting the mixture, grinding the resulting alloy ingot to form a powder, and hot pressing the powder, wherein the grinding and the hot pressing are carried out in the presence of a solvent represented by formula: $C_nH_{2n+1}OH$ or $C_nH_{2n+2}CO$ (wherein n is 1, 2 or 3).

4. The process for producing a thermoelectric material as claimed in claim 3, wherein the hot pressing is carried out in a non-oxidizing gas atmosphere.

5. A thermoelectric material obtained by the process as claimed in claim 1 which is used as an n-type thermoelectric device.

6. A thermoelectric material obtained by the process as claimed in claim 3, which is used as an n-type thermoelectric device.

* * * * *